(12) United States Patent
Otsuka

(10) Patent No.: US 11,437,351 B2
(45) Date of Patent: Sep. 6, 2022

(54) SEMICONDUCTOR DEVICE

(71) Applicant: Kioxia Corporation, Tokyo (JP)

(72) Inventor: Yasuo Otsuka, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 29 days.

(21) Appl. No.: 17/179,778

(22) Filed: Feb. 19, 2021

(65) Prior Publication Data

US 2022/0077115 A1 Mar. 10, 2022

(30) Foreign Application Priority Data

Sep. 9, 2020 (JP) .............................. JP2020-151299

(51) Int. Cl.
*H01L 21/00* (2006.01)
*H01L 25/065* (2006.01)
*H01L 23/00* (2006.01)
*H01L 23/64* (2006.01)

(52) U.S. Cl.
CPC ........ *H01L 25/0657* (2013.01); *H01L 23/647* (2013.01); *H01L 24/06* (2013.01); *H01L 24/48* (2013.01); *H01L 2224/04042* (2013.01); *H01L 2224/06135* (2013.01); *H01L 2224/48147* (2013.01); *H01L 2224/48227* (2013.01); *H01L 2224/48265* (2013.01); *H01L 2225/0651* (2013.01); *H01L 2225/06506* (2013.01); *H01L 2225/06562* (2013.01)

(58) Field of Classification Search
CPC .... H01L 25/0657; H01L 23/647; H01L 24/06
See application file for complete search history.

(56) References Cited

U.S. PATENT DOCUMENTS

| | | | |
|---|---|---|---|
| 6,621,155 B1 * | 9/2003 | Perino | ................. H01L 25/0657 257/691 |
| RE43,720 E * | 10/2012 | Perino | ..................... H01L 24/50 174/541 |
| 8,811,055 B2 * | 8/2014 | Yoon | ........................ G11C 5/02 365/189.05 |

(Continued)

FOREIGN PATENT DOCUMENTS

| | | |
|---|---|---|
| JP | 7-86509 A | 3/1995 |
| JP | 10-270648 A | 10/1998 |
| WO | WO-2020183802 A1 * 9/2020 | ....... H01L 23/49838 |

*Primary Examiner* — Laura M Menz
(74) *Attorney, Agent, or Firm* — Oblon, McClelland, Maier & Neustadt, L.L.P.

(57) ABSTRACT

A semiconductor device includes: a wiring board including first to third bonding pads; a chip stack including semiconductor chips, each chip having first to third connection pads, the first connection pads being connected in series to each other and to the first bonding pad through first bonding wires to form a first transmission channel, the second connection pads being connected in series to each other and to the second bonding pad through second bonding wires to form a second transmission channel, and the third connection pads being connected in series to each other and to the third bonding pad through third bonding wires to form a third transmission channel; and at least one of a first and a second terminating resistor being provided above the chip stack, the first resistor being connected to the first and second channels, the second resistor being connected to the first and third channels.

6 Claims, 6 Drawing Sheets

(56) References Cited

U.S. PATENT DOCUMENTS

| | | | | |
|---|---|---|---|---|
| 8,907,383 | B2* | 12/2014 | Lee | H01L 24/49 |
| | | | | 257/250 |
| 9,070,570 | B2* | 6/2015 | Lee | H01L 24/49 |
| 9,721,644 | B2* | 8/2017 | Kim | G11C 11/4096 |
| 10,437,766 | B2* | 10/2019 | Park | G06F 13/1668 |
| 2013/0021760 | A1* | 1/2013 | Kim | H01L 25/0657 |
| | | | | 257/773 |
| 2014/0175660 | A1* | 6/2014 | Lee | H01L 25/0657 |
| | | | | 257/773 |
| 2015/0054169 | A1* | 2/2015 | Lee | H01L 25/0657 |
| | | | | 257/773 |
| 2020/0294922 | A1* | 9/2020 | Otsuka | H01L 24/48 |
| 2021/0280557 | A1* | 9/2021 | Leslie | H01L 24/49 |
| 2021/0391305 | A1* | 12/2021 | Leslie | H01L 25/0657 |
| 2022/0068879 | A1* | 3/2022 | Sano | H01L 25/0652 |
| 2022/0077115 | A1* | 3/2022 | Otsuka | H01L 24/06 |
| 2022/0139879 | A1* | 5/2022 | Park | H01L 25/0657 |
| | | | | 257/777 |

* cited by examiner

SEMICONDUCTOR DEVICE

CROSS-REFERENCE TO RELATED APPLICATION

This application is based upon and claims the benefit of priority from Japanese Patent Application No. 2020-151299, filed on Sep. 9, 2020; the entire contents of which are incorporated herein by reference.

FIELD

Embodiments disclosed herein relate to a semiconductor device.

BACKGROUND

A semiconductor device such as a large-scale integrated circuit (LSI) includes a chip stack having a plurality of semiconductor chips stacked on a wiring board. The chip stack is electrically connected to the wiring board by bonding wires.

DETAILED DESCRIPTION

Figure 1:
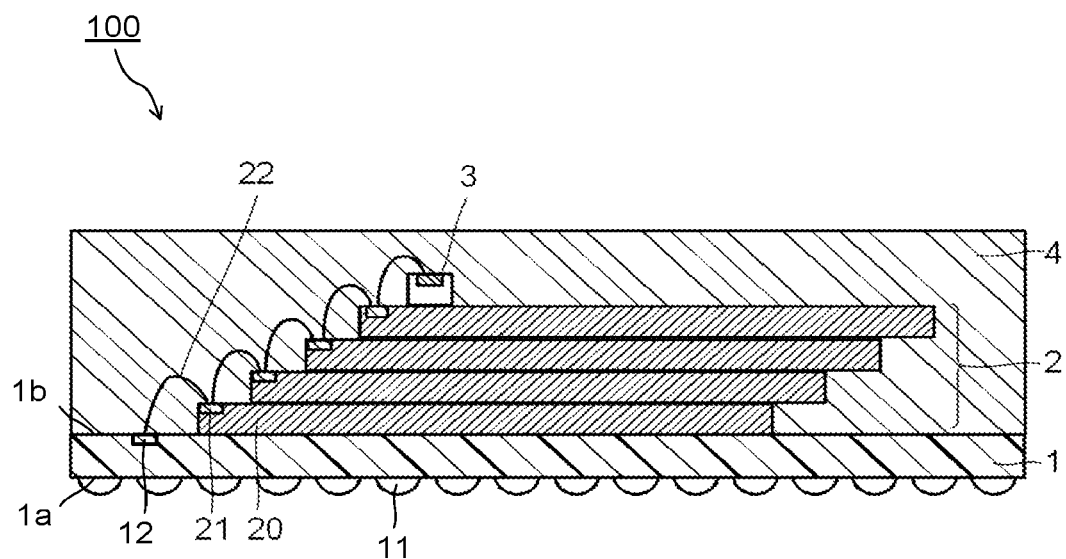
FIG. 1 is an explanatory schematic sectional view of a structure example of a semiconductor device.

A semiconductor device includes: a wiring board including a first, a second, and a third bonding pad, the first bonding pad being electrically connected to a signal terminal, the second bonding pad being electrically connected to a power supply terminal, and the third bonding pad being electrically connected to a grounding terminal; a chip stack including a plurality of semiconductor chips, the plurality of semiconductor chips being stacked in a stepped manner above the wiring board, and each chip having a first, a second, and a third connection pad, a plurality of the first connection pads being connected in series to each other and being connected in series to the first bonding pad through a plurality of first bonding wires to form a first transmission channel, a plurality of the second connection pads being connected in series to each other and being connected in series to the second bonding pad through a plurality of second bonding wires to form a second transmission channel, and a plurality of the third connection pads being connected in series to each other and being connected in series to the third bonding pad through a plurality of third bonding wires to form a third transmission channel; and at least one terminating resistor selected from the group consisting of a first and a second terminating resistor, the at least one terminating resistor being provided above the chip stack, the first terminating resistor being connected to the first and second transmission channels, the second terminating resistor being connected to the first and third transmission channels.

Embodiments will be hereinafter described with reference to the drawings. A relation of the thickness and planar dimension of each constituent element, thickness ratios among the constituent elements, and so on in the drawings may be different from actual ones. Further, in the embodiments, substantially the same constituent elements are denoted by the same reference signs and a description thereof may be partly omitted.

In this specification, "connect" includes not only physical connection but also electrical connection unless otherwise specified.

First Embodiment

Figure 2:
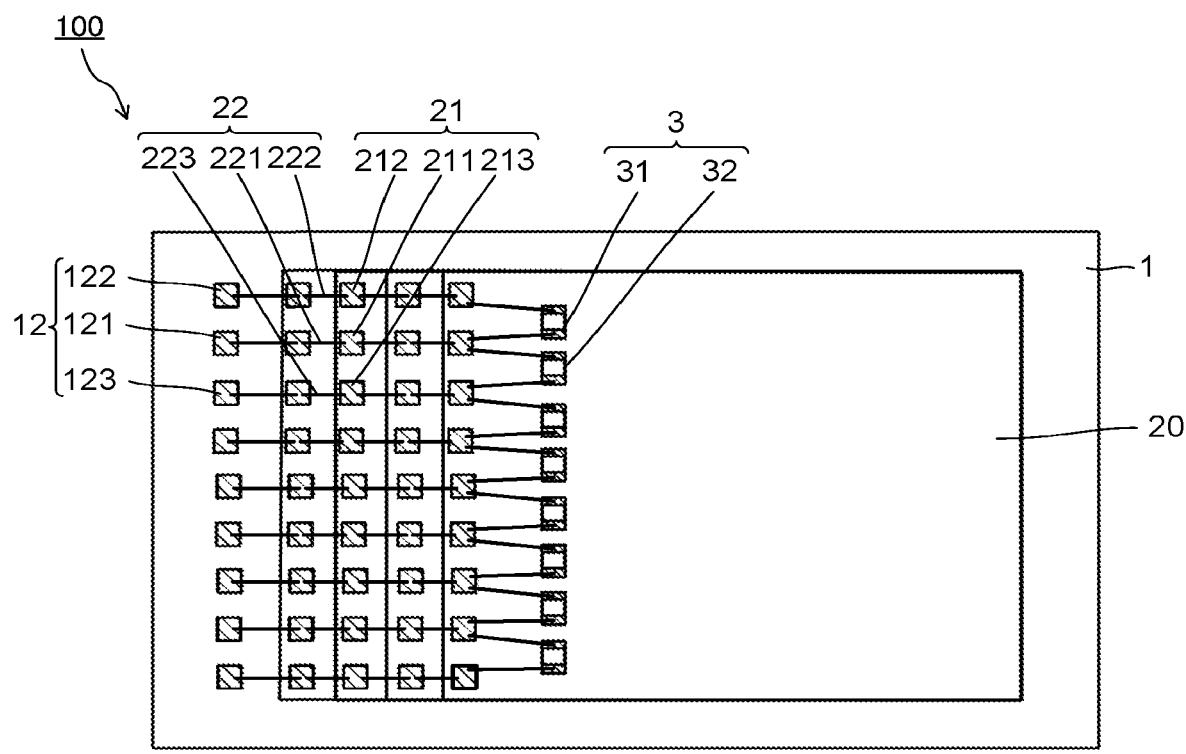
FIG. 2 is an explanatory schematic top view of the structure example of the semiconductor device.

A structure example of a semiconductor device will be hereinafter described. FIG. 1 is an explanatory schematic sectional view of the structure example of the semiconductor device. FIG. 2 is an explanatory schematic top view of the structure example of the semiconductor device. The semiconductor device 100 includes a wiring board 1, a chip stack 2, a plurality of terminating resistors 3, and an insulation resin layer 4.

The wiring board 1 has a plurality of external connection terminals 11 provided on a first surface 1a and a plurality of bonding pads 12 provided on a second surface 1b opposite the first surface 1a. Examples of the wiring board 1 include a printed wiring board (PWB).

The external connection terminals 11 include signal terminals, power supply terminals, and grounding terminals. The external connection terminals 11 are formed using, for example, gold, copper, solder, or the like. The external connection terminals 11 may also be formed using, for example, tin-silver-based or tin-silver-copper-based lead-free solder. The external connection terminals 11 each may also be formed using a stack of a plurality of metal materials. The external connection terminals 11 are formed using conductive balls in FIG. 1, but the external connection terminals 11 may be formed using bumps.

The bonding pads 12 are connected to the external connection terminals 11 through internal wiring of the wiring board 1. The bonding pads 12 each include a first bonding pad 121 electrically connected to the signal terminal, a second bonding pad 122 connected to the power supply terminal, and a third bonding pad 123 electrically connected to the grounding terminal. The bonding pads 12 contain a metal element, for example, copper, silver, gold, or nickel. For example, a plating film containing the aforesaid material may be formed by electrolytic plating, electroless plating, or the like to form the bonding pads 12. The bonding pads 12 may also be formed using conductive paste.

The chip stack 2 includes a plurality of semiconductor chips 20. Examples of the semiconductor chip 20 include a memory chip. The semiconductor chips 20 are stacked in a stepped manner on the second surface 1b of the wiring board 1. In other words, the semiconductor chips 20 partially overlap with one another. The semiconductor chips 20 are bonded to one another with an adhesive layer such as a die attach film therebetween. The chip stack 2 illustrated in FIG. 1 has the four semiconductor chips 20, but the number of the semiconductor chips 20 is not limited to the number in FIG. 1.

The semiconductor chips 20 each have a plurality of connection pads 21. The semiconductor chips 20 are connected to one another through a plurality of bonding wires 22. The connection pads 21 each include a first connection pad 211, a second connection pad 212, and a third connection pad 213. The bonding wires 22 include a plurality of first bonding wires 221, a plurality of second bonding wires 222, and a plurality of third bonding wires 223.

The plurality of first connection pads 211 in the plurality of semiconductor chips 20 are connected in series to one another and are connected in series to the first bonding pad 121, through the plurality of first bonding wires 221 to form a first transmission channel.

The plurality of second connection pads 212 in the plurality of semiconductor chips 20 are connected in series to one another and are connected in series to the second bonding pad 122, through the plurality of second bonding wires 222 to form a second transmission channel.

The plurality of third connection pads 213 in the plurality of semiconductor chips 20 are connected in series to one another and are connected in series to the third bonding pad 123, through the plurality of third bonding wires 223 to form a third transmission channel.

The bonding wires 22 contain a metal element, for example, gold, silver, copper, or aluminum.

The terminating resistors 3 are provided on the chip stack 2. The terminating resistors 3 each include a first chip resistor 31 and a second chip resistor 32. These chip resistors are mounted on the chip stack 2 with, for example, an adhesive layer therebetween. The first chip resistors 31 are each connected to the first transmission channel and the second transmission channel. The second chip resistors 32 are each connected to the first transmission channel and the third transmission channel. The use of the aforesaid chip resistors enables, for example, an area reduction of the terminating resistor 3. The resistance value of the terminating resistor 3 is not limited but is, for example, 50Ω or more.

Figure 3:
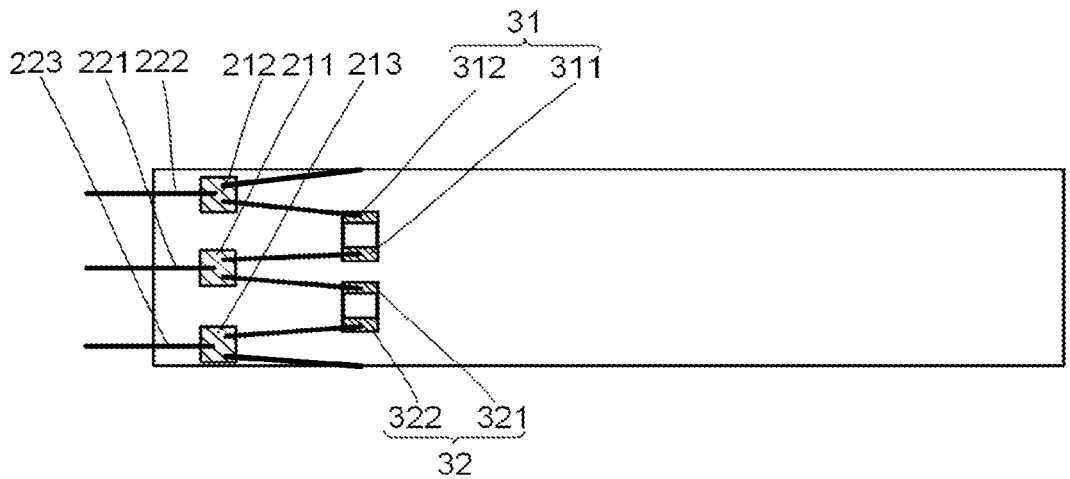
FIG. 3 is an enlarged view of part of FIG. 2.

FIG. 3 is an enlarged view of part of FIG. 2. The first chip resistor 31 has a first electrode pad 311 connected to the first transmission channel and a second electrode pad 312 connected to the second transmission channel. The second chip resistor 32 has a first electrode pad 321 connected to the first transmission channel and a second electrode pad 322 connected to the third transmission channel.

Figure 4:
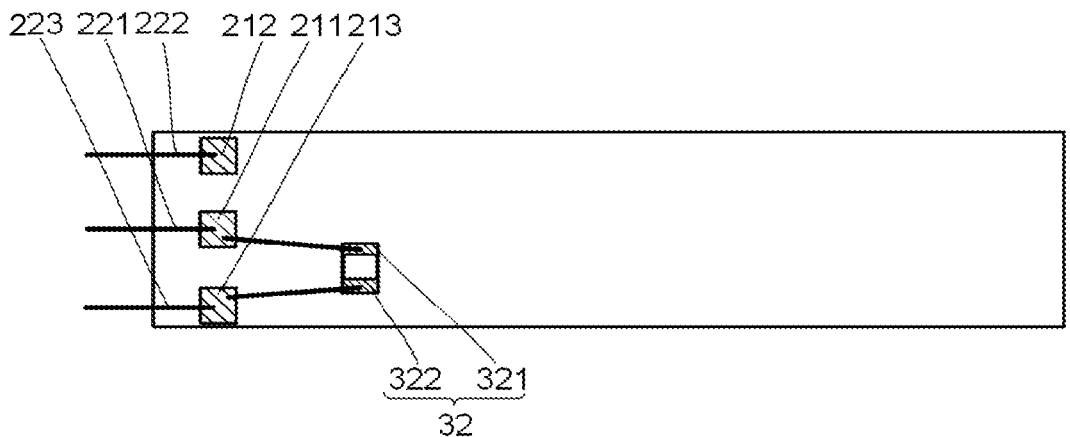
FIG. 4 is an explanatory schematic view of another structure example of the semiconductor device.
Figure 5:
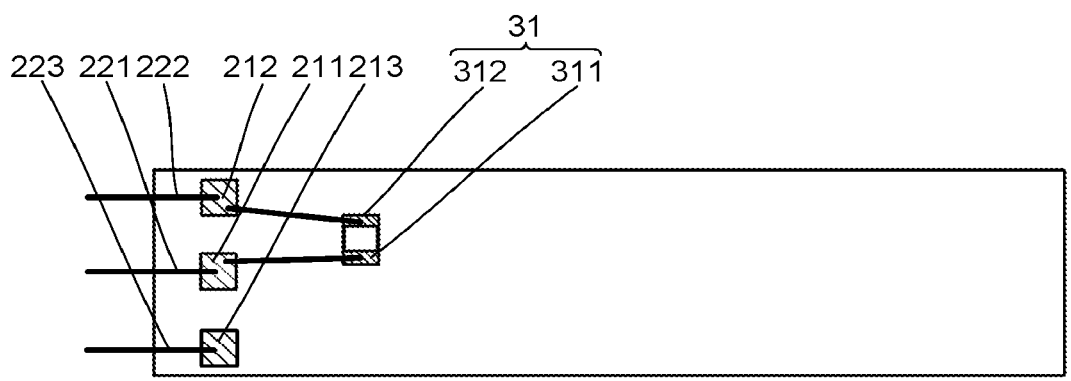
FIG. 5 is an explanatory schematic view of another structure example of the semiconductor device.

The semiconductor device 100 only needs to have at least one terminating resistor 3. FIG. 4 and FIG. 5 are explanatory schematic views of other structure examples of the semiconductor device 100. In the other structure examples, the semiconductor device 100 does not have the first chip resistor 31 as illustrated in FIG. 4 or does not have the second chip resistor 32 as illustrated in FIG. 5. For parts other than these different points, the description of the semiconductor device 100 illustrated in FIG. 1 and FIG. 2 can be referred to as required.

The insulation resin layer 4 covers the chip stack 2, the bonding wires 22, and the terminating resistors 3. The insulation resin layer 4 contains an inorganic filler such as silicon oxide ($SiO_2$) and is formed by a molding method such as transfer molding, compression molding, or injection molding, using a sealing resin in which the inorganic filler is mixed with an organic resin or the like, for instance.

In the semiconductor device of this embodiment, a resistance value of the first chip resistor 31, a resistance value of the second chip resistor 32, or a parallel combined resistance value of the first chip resistor 31 and the second chip resistor 32 is matched to a characteristic impedance of the first transmission channel, thereby reducing a reflected wave of a signal through the signal terminal.

Figure 6:
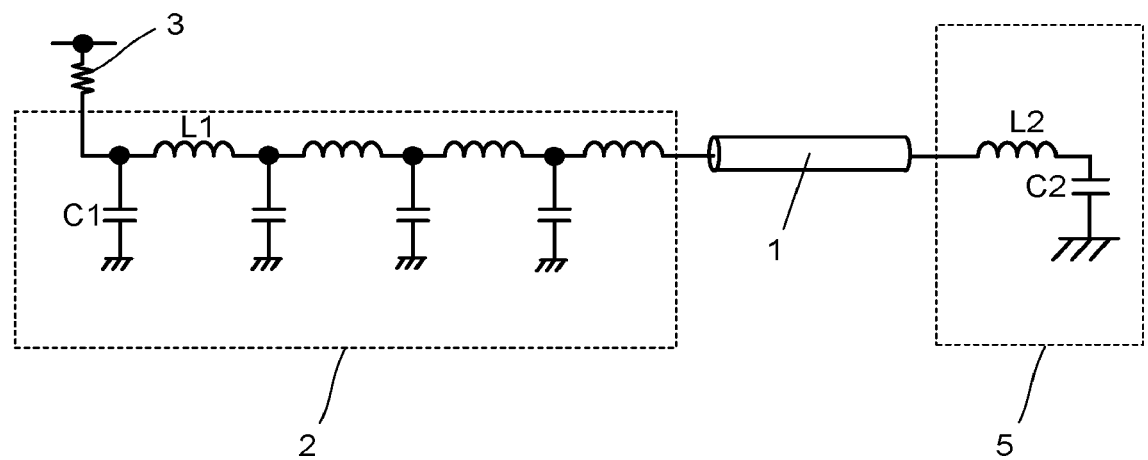
FIG. 6 is an equivalent circuit diagram of a semiconductor memory device.
Figure 7:
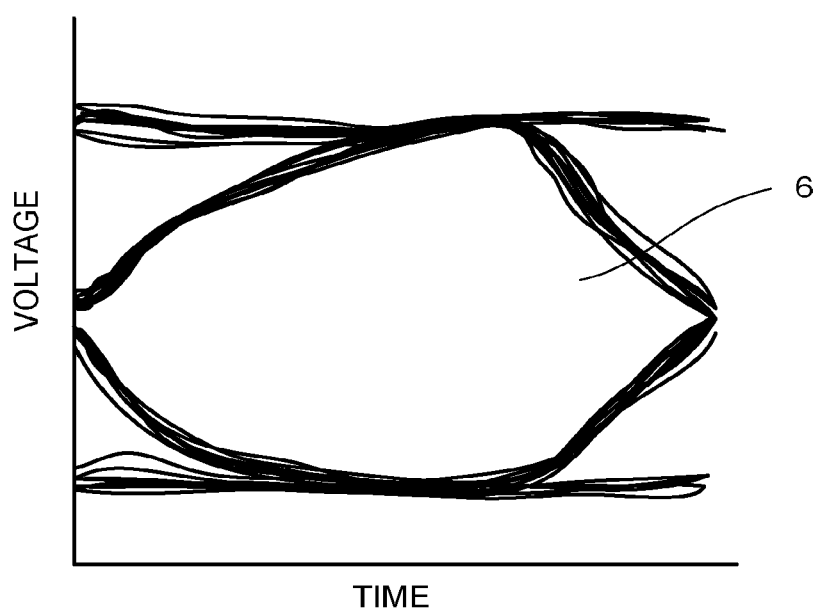
FIG. 7 is a chart illustrating an example of an EYE pattern of a signal that is input/output through a signal terminal.

Here, to explain the effect of reducing the reflected wave by the terminating resistor 3, how a connection configuration of a memory and a memory controller of a semiconductor memory device relates to the quality deterioration of a signal will be described with reference to FIG. 6 and FIG. 7. FIG. 6 is an equivalent circuit diagram of the semiconductor memory device. FIG. 7 is a chart illustrating an example of an EYE pattern of a signal that is input/output through a signal terminal.

The semiconductor memory device includes a memory composed of a chip stack 2 and a memory controller 5. The chip stack 2 has capacitance components C1 and inductance components L1. The memory controller 5 has a capacitance component C2 and an inductance component L2. The chip stack 2 and the memory controller 5 are electrically connected through a wiring board 1. These elements form the aforesaid first transmission channel.

In the semiconductor memory device, a reflective wave of a signal is generated through the first transmission channel at, for example, a read time. This increases, for example, a variation of the signal to narrow an EYE pattern 6. The above phenomenon is more conspicuous as the transfer speed between the chip stack 2 and the memory controller 5 is higher.

On the other hand, by connecting the terminating resistor 3 to the first transmission channel as illustrated in FIG. 6 and matching the resistance value of the terminating resistor 3 to the characteristic impedance of the first transmission channel, it is possible to reduce a reflected wave of the signal. This can reduce the narrowing of the EYE pattern 6. Therefore, it is possible to reduce the quality deterioration of the signal.

It is known that, in one conventional semiconductor device, a terminating resistor is connected to a signal line connected to a single semiconductor chip. However, in the case where a plurality of semiconductor chips are stacked as in the semiconductor device of this embodiment, it is difficult to reduce a reflected wave of a signal unless a resistance value of a terminating resistor is matched to a characteristic impedance of a transmission channel including conductors electrically connecting the semiconductor chips to one another and connection pads of the semiconductor chips.

Further, it is known that another conventional semiconductor device uses on-die termination (ODT) in which a terminating resistor is built in an input circuit including input elements in semiconductor chips. However, in ODT, if a characteristic impedance of a transmission channel including conductors electrically connecting semiconductor chips to one another and connection pads of the semiconductor chips is small such as ten several Ω, the circuit size of ODT becomes large and the size of the semiconductor chips becomes large. Further, in ODT, it is not possible to switch terminating methods or adjust the resistance value of ODT unless a terminating method switching circuit and an ODT resistance value adjusting circuit are assembled at the stage of circuit design, and thus a flexible change is not possible after the circuit is designed.

On the other hand, in the semiconductor device of this embodiment, the terminating resistor connected to the first transmission channel including the bonding wires connecting the plurality of semiconductor chips are provided on the chip stack. Therefore, any of the semiconductor chips need not have any terminating resistor. This can enhance the degree of freedom of circuit design of the semiconductor chips.

Second Embodiment

Figure 8:
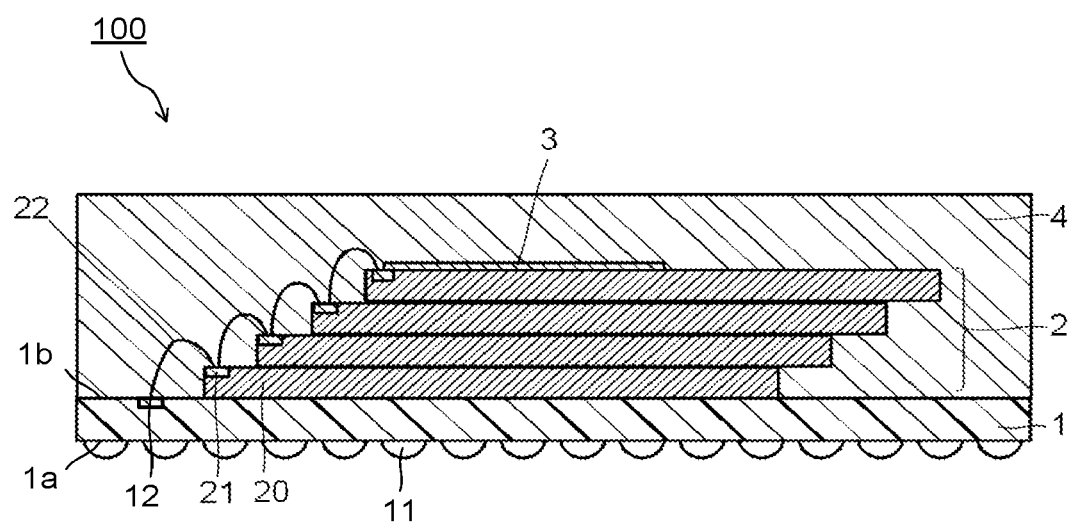
FIG. 8 is an explanatory schematic sectional view of another structure example of the semiconductor device.
Figure 9:
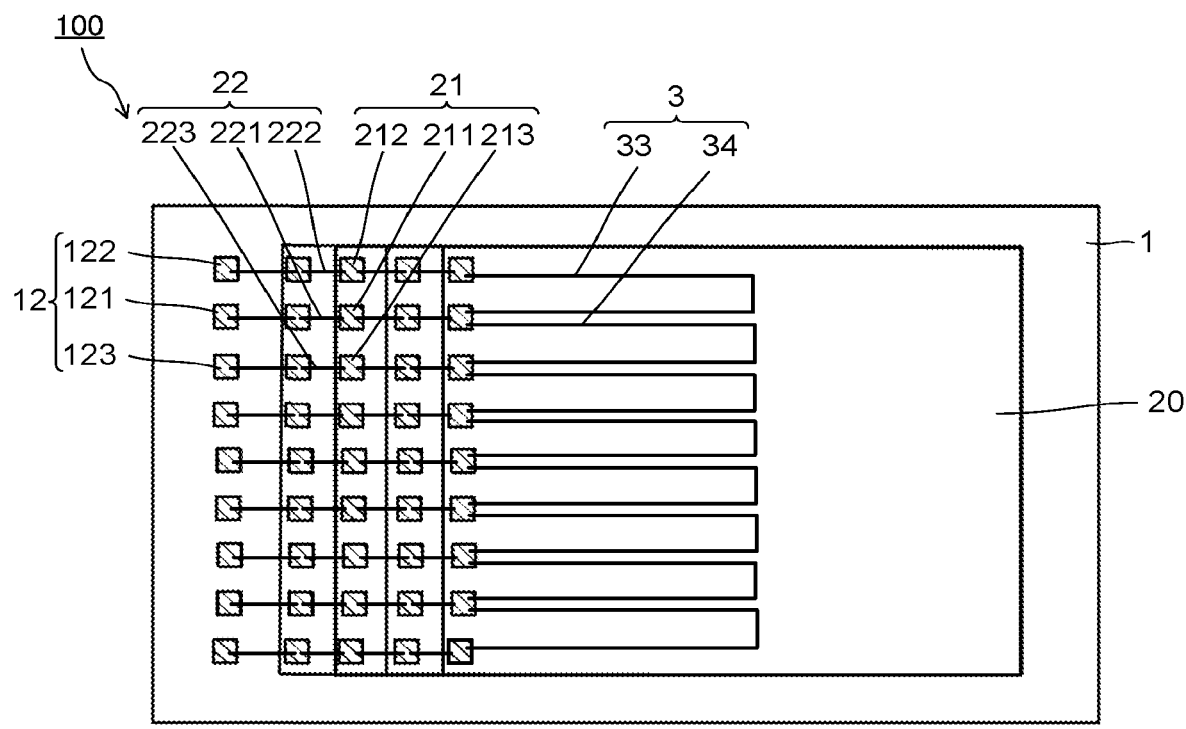
FIG. 9 is an explanatory schematic top view of the other structure example of the semiconductor device.

Another structure example of the semiconductor device will be hereinafter described. FIG. 8 is an explanatory schematic sectional view of the other structure example of the semiconductor device. FIG. 9 is an explanatory schematic top view of the other structure example of the semiconductor device. The semiconductor device 100 includes a wiring board 1, a chip stack 2, a plurality of terminating resistors 3, and an insulation resin layer 4. The wiring board 1, the chip stack 2, and the insulation resin layer 4 are the same as the wiring board 1, the chip stack 2, and the insulation resin layer 4 of the semiconductor device of the first embodiment, and therefore a description thereof will be omitted, and the description thereof in the first embodiment can be referred to as required.

The terminating resistors 3 are provided on the chip stack 2. The terminating resistors 3 each include a first wiring line 33 and a second wiring line 34. These wiring lines are formed on a surface of the chip stack 2 by a method such as, for example, sputtering or plating. The wiring lines contain, for example, a material such as gold, silver, copper, titanium, or chromium. The first wiring lines 33 are each connected to a first transmission channel and a second transmission channel. The second wiring lines 34 are each connected to the first transmission channel and a third transmission channel. The use of the aforesaid wiring lines facilitates adjusting the resistance value of the terminating resistor 3, for instance.

Figure 10:
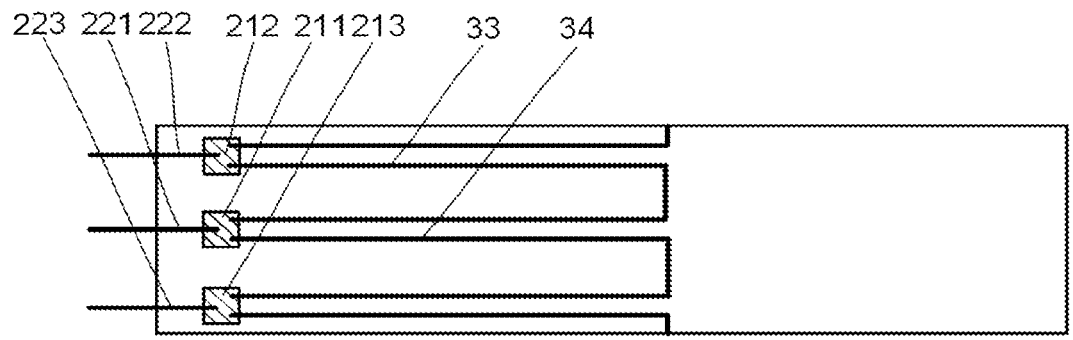
FIG. 10 is an enlarged view of part of FIG. 9

FIG. 10 is an enlarged view of part of FIG. 9. The first wiring line 33 has one end connected to the first transmission channel and the other end connected to the second transmission channel. The second wiring 34 has one end connected to the first transmission channel and the other end connected to the third transmission channel.

Figure 11:
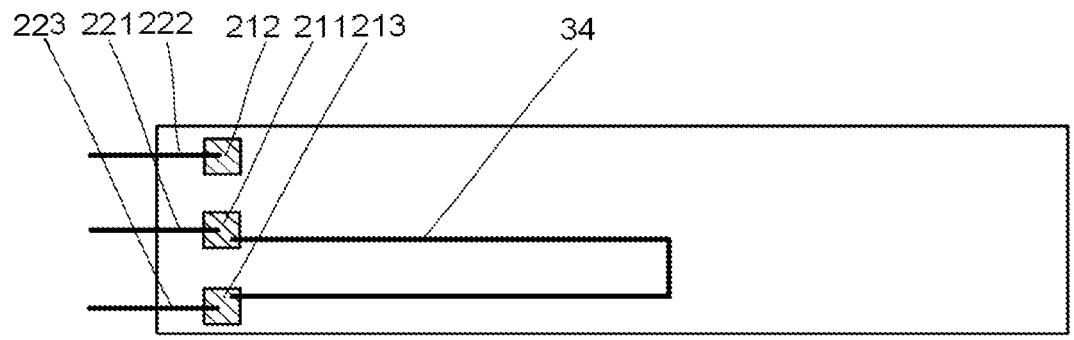
FIG. 11 is an explanatory schematic view of another structure example of the semiconductor device.
Figure 12:
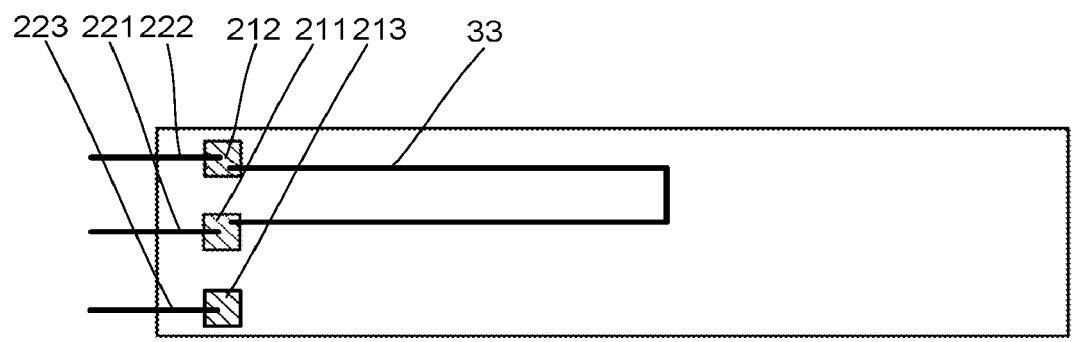
FIG. 12 is an explanatory schematic view of another structure example of the semiconductor device.

The semiconductor device 100 only needs to have at least one terminating resistor 3. FIG. 11 and FIG. 12 are explanatory schematic views of other structure examples of the semiconductor device 100. In the other structure examples, the semiconductor device 100 does not have the first wiring line 33 as illustrated in FIG. 11 or does not have the second wiring line 34 as illustrated in FIG. 12. For parts other than these different points, the description of the semiconductor device 100 illustrated in FIG. 8 and FIG. 9 can be referred to as required.

Figure 13:
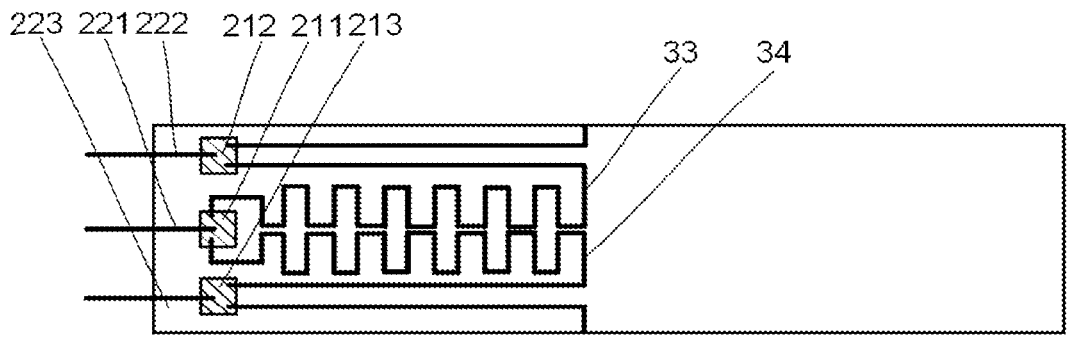
FIG. 13 is an explanatory schematic view of another planar shape of a first wiring line and a second wiring line.

The planar shape of the first wiring line 33 and the second wiring line 34 illustrated in FIG. 9 to FIG. 12 is a loop shape, but the planar shape of the first wiring line 33 and the second wiring line 34 is not limited. FIG. 13 is an explanatory schematic view of another planar shape of the first wiring line 33 and the second wiring line 34. The other planar shape of the first wiring line 33 and the second wiring line 34 is a meandering shape. This facilitates increasing the resistance of the terminating resistor 3.

Figure 14:
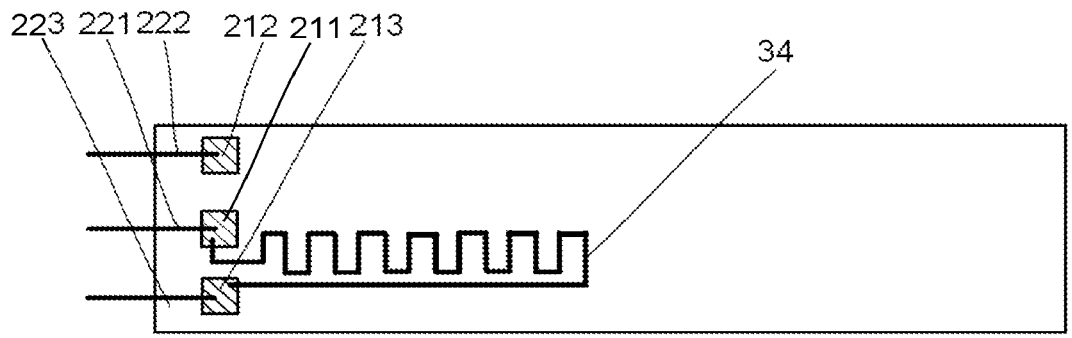
FIG. 14 is an explanatory schematic view of another structure example of the semiconductor device.
Figure 15:
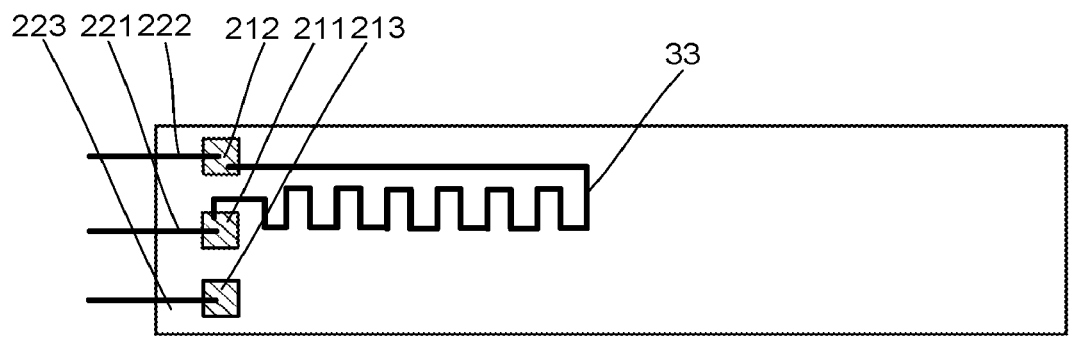
FIG. 15 is an explanatory schematic view of another structure example of the semiconductor device.

FIG. 14 and FIG. 15 are explanatory schematic views of other structure examples of the semiconductor device 100. In the other structure examples, the semiconductor device 100 does not have the first wiring line 33 having the meandering shape as illustrated in FIG. 14 or does not have the second wiring line 34 having the meandering shape as illustrated in FIG. 15. For parts other than these different points, the description of the semiconductor device 100 illustrated in FIG. 8 and FIG. 9 can be referred to as required.

In the semiconductor device of this embodiment, a resistance value of the first wiring line 33, a resistance value of the second wiring line 34, or a parallel combined resistance value of the first wiring line 33 and the second wiring line 34 is matched to a characteristic impedance of the first transmission channel, thereby reducing a reflected wave of a signal through a signal terminal. This can reduce the quality deterioration of the signal.

Further, in the semiconductor device of this embodiment, since the terminating resistor connected to the first transmission channel including the bonding wires connecting the plurality of semiconductor chips are provided on the chip stack, any of the semiconductor chips need not have any terminating resistor. This can enhance the degree of freedom of circuit design of the semiconductor chips.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a wiring board including a first, a second and a third bonding pad, the first bonding pad being electrically connected to a signal terminal, the second bonding pad being electrically connected to a power supply terminal, and the third bonding pad being electrically connected to a grounding terminal;
   a chip stack including a plurality of semiconductor chips, the plurality of semiconductor chips being stacked in a stepped manner above the wiring board, each chip having a first, a second and a third connection pad, a plurality of the first connection pads being connected in series to each other and being connected in series to the first bonding pad through a plurality of first bonding wires to form a first transmission channel, a plurality of the second connection pads being connected in series to each other and being connected in series to the second bonding pad through a plurality of second bonding wires to form a second transmission channel, and a plurality of the third connection pads being connected in series to each other and being connected in series to the third bonding pad through a plurality of third bonding wires to form a third transmission channel; and
   at least one terminating resistor selected from the group consisting of a first and a second terminating resistor, the at least one terminating resistor being provided above the chip stack, the first terminating resistor being connected to the first and second transmission channels, the second terminating resistor being connected to the first and third transmission channels.

2. The device according to claim 1,
wherein a resistance value of the first terminating resistor is matched to a characteristic impedance of the first transmission channel, and
wherein a resistance value of the second terminating resistor is matched to the characteristic impedance of the first transmission channel.

3. The device according to claim 1,
wherein the at least one terminating resistor includes the first terminating resistor and the second terminating resistor, and
wherein a parallel combined resistance value of the first and second terminating resistors is matched to a characteristic impedance of the first transmission channel.

4. The device according to claim 1,
wherein the first terminating resistor includes a first chip resistor having a first electrode pad connected to the first transmission channel and a second electrode pad connected to the second transmission channel, and
wherein the second terminating resistor includes a second chip resistor having a third electrode pad connected to the first transmission channel and a fourth electrode pad connected to the third transmission channel.

5. The device according to claim 1,
wherein the first terminating resistor includes a first wiring line having one end connected to the first transmission channel and another end connected to the second transmission channel, and
wherein the second terminating resistor includes a second wiring line having one end connected to the first transmission channel and another end connected to the third transmission channel.

6. The device according to claim 1, wherein any of the plurality of semiconductor chips do not have a terminating resistor.

\* \* \* \* \*